United States Patent [19]

Reimer

[11] Patent Number: 4,532,576
[45] Date of Patent: Jul. 30, 1985

[54] PRINTED WIRING BOARD FILE AND METHOD OF UTILIZING THE SAME

[75] Inventor: William A. Reimer, Wheaton, Ill.

[73] Assignee: GTE Automatic Electric Incorporated, Northlake, Ill.

[21] Appl. No.: 527,635

[22] Filed: Aug. 29, 1983

[51] Int. Cl.³ .................. H05K 7/14; A47G 29/00
[52] U.S. Cl. ............................ 361/415; 29/729; 29/80; 211/41
[58] Field of Search ........... 361/415, 396, 391, 399, 361/394, 395, 413; 29/729, 78–80, 76–76 C; 206/328, 329, 332, 334, 454–456; 211/41

[56] References Cited

U.S. PATENT DOCUMENTS

| | | | |
|---|---|---|---|
| 3,671,812 | 6/1972 | Peluso et al. | 361/396 |
| 4,002,953 | 1/1977 | Tetlie | 211/41 |
| 4,301,494 | 10/1981 | Jordan | 361/399 |
| 4,382,517 | 5/1983 | Welsch | 361/415 |
| 4,472,765 | 9/1984 | Hughes | 361/413 |

OTHER PUBLICATIONS

Gustafson, Zero Insertion Force Connector, IBM Technical Disclosure Bulletin, vol. 13, No. V, Dec. 1970, p. 2048.
Uberbacher, Processor-Controlled Zero Insertion Force Connector, IBM Technical Disclosure Bulletin, vol. 23, No. 12, May 1981, pp. 5509–5510.

Primary Examiner—A. T. Grimley
Assistant Examiner—Tarick Basma
Attorney, Agent, or Firm—Robert J. Black; Gregory G. Hendricks

[57] ABSTRACT

A printed wiring board file arranged to mount printed wiring boards in an efficient manner while simultaneously providing for the convection cooling of such boards. The boards include components of varying heights. Each printed wiring board is supported by a connector at one side edge and a printed wiring board guide at the opposite side edge. Each board guide includes two sets of grooves which allow it to be used as a guide for the left or right sides of the boards. The first set of grooves is used when the board guide supports the left side of the printed wiring boards and the second set of grooves is used when the board guide supports the right side of the printed wiring boards. The grooves are formed in the board guide at a vertical spacing less than the minimum permitted vertical spacing for the printed wiring boards. Multiples of the groove spacing are selected to mount printed wiring boards with a minimum or greater than minimum spacing.

7 Claims, 5 Drawing Figures

PRINTED WIRING BOARD FILE AND METHOD OF UTILIZING THE SAME

CROSS-REFERENCES TO RELATED APPLICATIONS

Related, commonly assigned, co-pending applications include "Double File Printed Wiring Board Module," Ser. No. 527,634, "Printed Wiring Board Interconnect Arrangement," Ser. No. 527,636, "Low Insertion Force Correction Arrangement," Ser. No. 527,637, "Low Insertion Force Connection Arrangement," Ser. No. 527,638, and "Low Insertion Force Connection Arrangement," Ser. No. 527,639, all filed concurrently herewith.

BACKGROUND OF THE INVENTION

The present invention relates to printed wiring board files, and more particularly to printed wiring board files employing printed wiring board guides mounted parallel to each other to support printed wiring boards in adjacent files.

Printed wiring board files mounting printed wiring boards are well known to those skilled in the art. One type employs four vertical supports located at the corners of a vertical column. Three mother boards are mounted to three supports in such a manner as to enclose three of the four vertical sides of the column. Horizontally oriented connectors are attached to the mother boards at fixed vertical intervals. The fourth side is retained free of obstruction to permit the insertion of printed wiring boards in the connectors. Printed wiring boards mounted in this manner form a vertical stack of horizontally oriented printed wiring boards.

Such files, while operating generally satisfactorily, require board spacing sufficient to accommodate modate the tallest component to be mounted on any printed wiring board. This results in inefficient use of space when only a small number of printed wiring boards mount such tall components. Also, due to the nature of the printed wiring board file, external means of removing heat generated by the printed wiring boards, e.g., a fan, is frequently found to be necessary.

Another type of file employs a metallic board cage mounting printed wiring boards vertically. The cage includes an upper surface, lower surface, two side surfaces, and a plurality of connectors mounted vertically across the back of the cage. Upper guides and lower guides are formed in the upper and lower surfaces, respectively. Each upper guide is formed by making two U-shaped cuts in the upper surface. Each cut has an elongated base and two short legs perpendicular to the base. The bases are parallel and opposite each other and the legs of each cut extend toward the legs of the other cut. Once cut, the portion of the surface internal to each U-shaped cut is then bent downward perpendicular to the upper surface along a line extending between the ends of each such cut to form the board guide. Guides are formed in the lower surface in a similar manner.

A primary disadvantatge of such a file is that costly guide cutting and metal forming equipment is required to manufacture the board cage and guides. Otherwise such files function well when used individually. However, when these printed wiring board files are stacked one above another in a rack or frame, the upper files, due to heated air from below mounted files, can overheat.

The present invention overcomes these heat and spacing problems by providing a new and improved arrangement for mounting printed wiring boards.

SUMMARY OF THE INVENTION

In accordance with the present invention, a printed wiring board file is provided. This printed wiring board file includes a vertically oriented side plane, positioned adjacent the first edge, at least one connector affixed to the side plane adjacent the printed wiring board, and engaging the first edge, and a support plate. The printed wiring board file further includes a plurality of positioners positioning the support plate parallel to the side plane and adjacent to the second board edge, and a printed wiring board guide attached to the support plate and including at least first and second grooves. This printed wiring board file includes at least one printed wiring board, which includes first and second edges, and a plurality of connector tabs adjacent the first edge to provide electrical access to the board. The first groove engages with the board second edge when the support plate is positioned in a first direction relative to the side plane, and the second groove engages with the board second edge when the support plate is positioned in a second direction relative to the side plane.

DESCRIPTION OF THE PREFERRED EMBODIMENT

Figure 1:
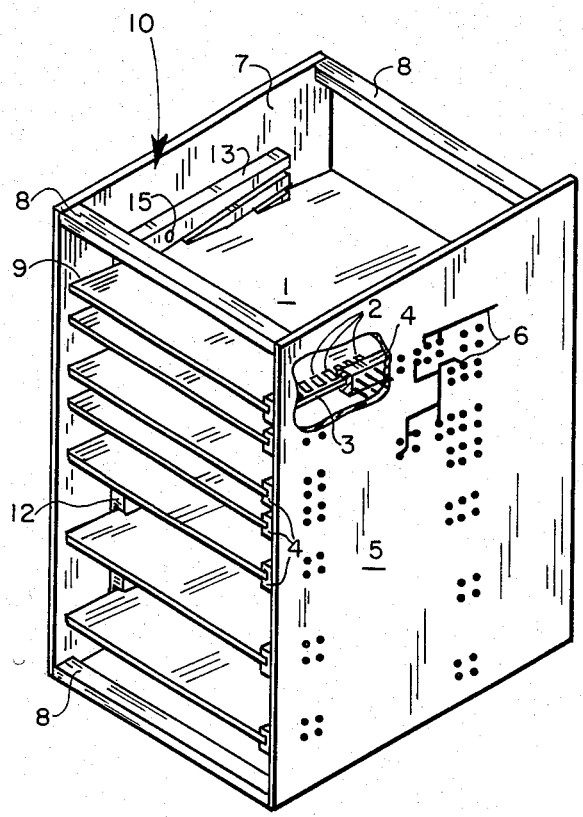
FIG. 1 is a perspective view of a printed wiring board file of the subject invention in which printed wiring boards are supported by a board guide at their left side.

Referring now to FIG. 1, a printed wiring board file is shown which mounts a plurality of printed wiring boards 1 in accordance with the present invention. Each printed wiring board 1 includes a plurality of connector tabs 2 formed at its side edge 3. A plurality of connectors 4 are mounted to a side positioned interconnect plane 5. These connectors cooperate with a plurality of printed wiring conductors 6 formed on interconnect plane 5 to engage, support, and interconnect the printed wiring boards 1. The printed wiring conductors 6 may be formed on external or internal surfaces (not shown) of the interconnect plane 5 to achieve the desired interconnect pattern. Zero-insertion-force connectors may be used to reduce the force required to insert the printed wiring boards 1 into the connectors 4. A support plate 7 is mounted to the interconnect plane 5 by a plurality of positioning members 8. The support plate 7 may be formed of electrically or magnetically conductive material to shield the printed wiring boards 1 from stray electrical or magnetic signals.

Figure 2:
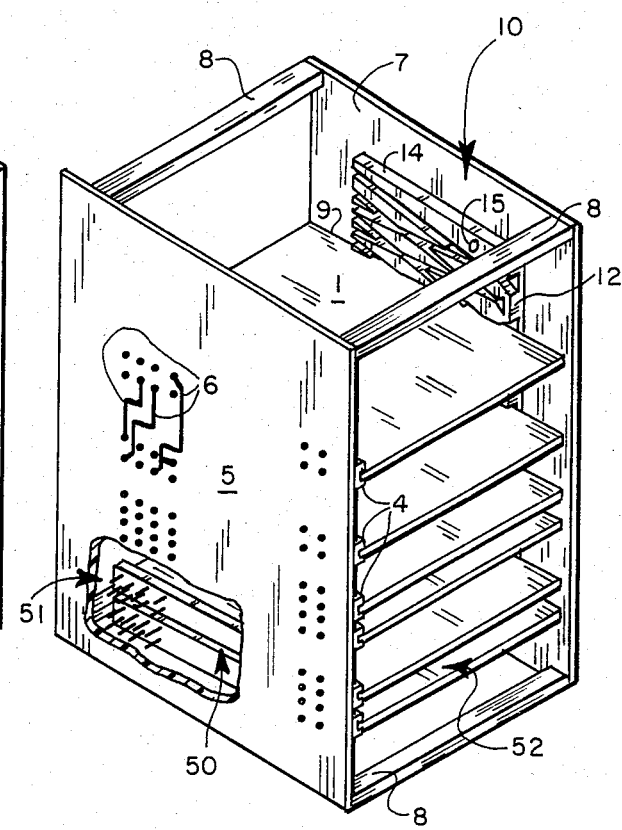
FIG. 2 is a perspective view of a printed wiring board file of the subject invention in which printed wiring boards are supported by a board guide at their right side.
Figures 3, 4:
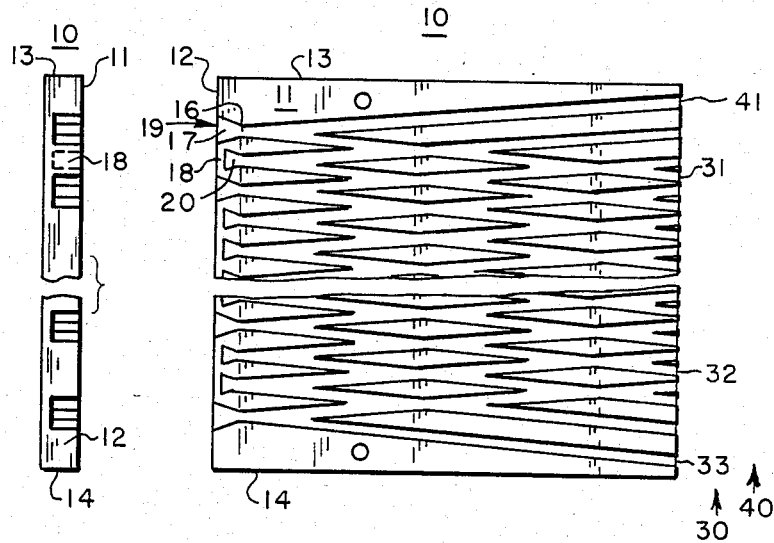
FIG. 3 is a front view of the board guide of the subject invention.
FIG. 4 is a side view of the board guide of the subject invention as used in FIGS. 1 and 2.

Referring now to FIG. 4, the printed wiring board guide 10 includes a first set of grooves 30, and a second set of grooves 40. The first set of grooves includes grooves 31 through 33 and the second set of grooves includes groove 41. The board guide 10 engages an opposite side edge 9 (shown in FIG. 1) of the printed wiring boards 1. The first set of grooves 30 is used to support printed wiring boards 1 at their left side via side edge 3. The second set of grooves 40 is used to support printed wiring boards 1 at their right side via an opposite side edge 9. The connectors 4 (shown in FIG. 2), and the grooves 30 and 40 are positioned to incline the printed wiring boards 1 at an angle to the horizontal. In such position, the printed wiring boards 1, the support plate 7, and the interconnect plane 5 cooperate to form a plurality of sloping ducts generally indicated by 50 above each of the printed wiring boards 1. Each duct includes a lower end generally indicated by 51 and an upper end generally indicated by 52. In operation, air enters each duct 50 at the lower duct end 51 and flows past the printed wiring board 1 by means of convection, thus cooling circuitry mounted thereon. The air then exits through the higher duct end 52.

Referring now to FIG. 1, the board guide 10 may be attached to the support plate 7 by any of the well known fastening means known to those skilled in the art. For example, rivets 15 may be used to attach the board guide 10 to the support plate 7.

Referring now to FIG. 4, the board guide 10 includes a side surface 11, front edge 12, first end 13, and second end 14. First grooves 30 are formed in the side surface 11 of board guide 10 and slope downward and away from front edge 12. The second grooves 40 are formed in the side surface 11 of the board guide 10 and slope upward and away from the front edge 12. Each groove of the first set of grooves 30 intersects at least one groove of the second set of grooves 40 at a point near the front edge 12 of the board guide 10. For example, the intersection of grooves 31 and 41 forms a common groove 16. The other edge 9 (shown in FIG. 1) of the printed wiring board 1 may enter a groove of the first set of grooves 30 or a groove of the second set of grooves 40 through common groove 16.

A wide-mouth alignment channel 17 is included between the front edge 12 of the board guide 10 and the common groove 16. Alignment channel 17 includes mouth 19 positioned in the plane of front edge 12. A frangible panel may be positioned across the alignment channel mouth to prevent printed wiring board other edge 9 access thereto. In this regard, a frangible panel 18 is positioned across a wide-mouth alignment channel 20 thus preventing access to the channel 20. Printed wiring board guide grooves are rendered useable in a particular circuit unit by removing the frangible panel from the alignment channel mouth thus providing access to the selected groove. In this regard, the frangible panel is shown removed from the mouth 19 of the alignment channel 17, thereby providing access to first groove 31 and second groove 41 via common channel 16.

Referring to FIG. 1, the board guide 10, when used to support the printed wiring boards 1 from the left side, is affixed to the support plate 7 by means of the rivets 15 oriented with the front edge 12 facing forward and the first edge 13 facing upward. In this orientation, the first set of grooves 30 is used to support the printed wiring boards 1 and the second set of grooves 40 is not used. Similarly referring to FIG. 2, when the board guide 10 is used to support the printed wiring boards 1 from the right side, the board guide 10 is affixed to the support plate 7 by the rivets 15 oriented with the front edge 12 facing forward and the second edge 14 facing upward.

In this orientation, the second set of grooves 40 is employed to support the printed wiring boards 1 and the first set of grooves 30 is not used.

Referring now to FIG. 4, the grooves of the first set of grooves 30 and the second set of grooves 40 are formed in the side surface 11 of the board guide 10 at a vertical spacing which is a fraction of a predetermined minimum board spacing. In this regard, the grooves of the first set of grooves 30 may be formed with a vertical spacing equal to one-half the minimum permitted printed wiring board spacing. The printed wiring board 1 may thus be mounted at the minimum board spacing by selecting every second groove for printed wiring board mounting. The mounting of over-height boards may be efficiently accomplished by selecting increased multiples of the groove spacing. In this regard, every third groove may be selected. For example, if the groove 33 is selected for mounting one of the printed wiring boards 1 requiring one and one-half times the minimum printed wiring board height, then the groove 32 would be selected for mounting the next higher printed wiring board 1.

Alternately, groove spacings of one-third, one-fourth, or other fractional spacings may be selected to more efficiently package printed wiring boards of varying heights.

Figure 5:
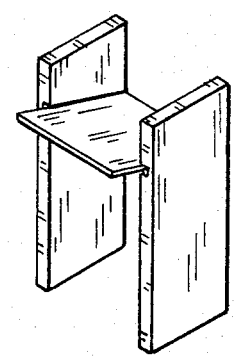
FIG. 5 is a perspective view of the subject invention in which printed wiring board are supported by board guides on both left and right sides.

Thus the printed wiring board file of the present invention includes a printed wiring boad guide arranged to support printed wiring boards from their left, right or both sides (as shown in FIG. 5). This printed wiring board guide includes multiple grooves which can be selectively rendered operative to accommodate printed wiring boards of varying heights.

The present invention has been described with reference to specific embodiments thereof for the purpose of illustrating the manner in which the invention may be used to advantage. It will be appreciated by those skilled in the art that numerous modifications of the present invention can be made without departing from the spirit of the invention which shall be limited only by the scope of the claims appended hereto.

What is claimed is:

1. A printed wiring board file comprising:
a vertically oriented side plane;
at least one connector affixed to said side plane;
a support plate;
a plurality of positioners positioning said support plane parallel to said side plane;
a printed wiring board guide attached to said support plane and including at least first and second grooves;
at least one printed wiring board, including first and second edges, and a plurality of connector tabs adjacent to said first edge to provide electrical access to said board, said first groove engaged with said board second edge when said support plane is positioned in a first direction relative to said side plane, and said second groove engaged with said board second edge when said support plate is positioned in a second direction relative to said side plane; and
a frangible panel included in said board guide, preventing access of said printed wiring board to said first and second grooves, said panel being removable to permit positioning said board within a selected one of said grooves.

2. A printed wiring board file as claimed in claim 1, wherein: there is included a plurality of printed wiring boards said board guide grooves are spaced apart at a distance which is a fraction of a predetermined minimum board spacing;

adjacent printed wiring boards being inserted in selected grooves and connectors which are separated by a spacing of an integer multiple of said fractional spacing.

3. A printed wiring board file as claimed in claim 1, wherein: said connectors may be of the zero-insertion-force type to permit positioning of said boards within said connectors with reduced force.

4. A printed wiring board file as claimed in claim 1, wherein: said support plate is electrically conductive.

5. A printed wiring board file as claimed in claim 1, wherein: said support plate is magnetically conductive.

6. A group of printed wiring boards and method for mounting said group of printed wiring boards in relation to each other with a minimum of unused space between adjacent boards of differing thicknesses, said printed wiring boards each mounting components, said thickness of each board determined by the maximum height of thereon mounted components, said method comprising the steps of:

determining a fractional spacing, said fractional spacing being determined such that multiples of said fraction will exceed but closely approximate the maximum heights of components mounted on said printed wiring boards;

forming a printed wiring board guide including a plurality of grooves each spaced apart at said determined fractional spacing and each including frangible panel covered mouth;

supporting said guide;

selecting a guide groove for each printed wiring board to be mounted, said guide groove selected to position each said printed wiring board away from an adjacent printed wiring board a distance exceeding but closely approximating the maximum height of components mounted on said printed wiring board;

removing said associated frangible panel from said selected groove mouth; and positioning said printed wiring board within said selected grooves via said included mouth.

7. A method according to claim 6, wherein: following said positioning step, said mounting method includes the step of engaging each of said printed wiring boards within a corresponding connector, said corresponding connectors each positioned opposite a different one of said selected guide grooves.

\* \* \* \* \*